(12) United States Patent
Hong

(10) Patent No.: US 8,872,197 B2
(45) Date of Patent: Oct. 28, 2014

(54) ORGANIC LIGHT EMITTING DIODE DISPLAY AND METHOD OF MANUFACTURING THE SAME

(75) Inventor: Sang-Min Hong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 883 days.

(21) Appl. No.: 12/906,755

(22) Filed: Oct. 18, 2010

(65) Prior Publication Data

US 2011/0186869 A1    Aug. 4, 2011

(30) Foreign Application Priority Data

Feb. 2, 2010 (KR) .................. 10-2010-0009587

(51) Int. Cl.
*H01L 29/04* (2006.01)
*H01L 31/20* (2006.01)
*H01L 51/56* (2006.01)
*H01L 51/52* (2006.01)

(52) U.S. Cl.
CPC ................ *H01L 51/52* (2013.01); *H01L 51/56* (2013.01)
USPC ................... 257/88; 257/59; 257/40; 257/79; 257/72; 257/100; 438/34; 438/158

(58) Field of Classification Search
USPC ............ 257/88, 68, 71, 59, 40, 642, 759, 72, 257/443, 79, 100
See application file for complete search history.

(56) References Cited

U.S. PATENT DOCUMENTS

| 7,498,186 | B2 | 3/2009 | Lee |
| 2007/0170324 | A1 | 7/2007 | Lee et al. |
| 2007/0170857 | A1 | 7/2007 | Choi et al. |
| 2007/0173167 | A1 | 7/2007 | Choi |
| 2007/0176185 | A1* | 8/2007 | Lee et al. .......... 257/79 |
| 2007/0176563 | A1* | 8/2007 | Kim et al. ...... 313/504 |
| 2007/0194690 | A1 | 8/2007 | Lee |
| 2007/0232182 | A1* | 10/2007 | Park ................ 445/25 |
| 2008/0012474 | A1* | 1/2008 | Sung et al. ..... 313/504 |
| 2008/0074022 | A1 | 3/2008 | Wang et al. |
| 2008/0074036 | A1 | 3/2008 | Wang et al. |
| 2009/0068917 | A1* | 3/2009 | Kim ................ 445/25 |

(Continued)

FOREIGN PATENT DOCUMENTS

| KR | 10-2003-0086727 | 11/2003 |
| KR | 10-0673765 B1 | 1/2007 |

(Continued)

*Primary Examiner* — Chuong A Luu

(74) *Attorney, Agent, or Firm* — Robert E. Bushnell, Esq.

(57) ABSTRACT

An organic light emitting diode (OLED) display comprises a first substrate and a second substrate configured to comprise a pixel area and a non-pixel area other than the pixel area, a sealing member configured to adhere the first substrate and the second substrate together, reinforcing materials filled into the non-pixel area of the first substrate and the second substrate, and an accommodation unit configured to accommodate some of the reinforcing materials within at least one of the first substrate and the second substrate corresponding to the non-pixel area. A method of manufacturing the OLED display comprises: preparing a mother substrate, including a plurality of display panels and cutting lines between two adjacent display panels; cutting the mother substrate into separated display panel units; forming grooves on a side of each display panel unit; and filling reinforcing materials in a non-pixel area of the display panel units, some of the reinforcing materials flowing into the grooves.

10 Claims, 6 Drawing Sheets

(56) References Cited

U.S. PATENT DOCUMENTS

| | | |
|---|---|---|
| 2009/0174825 A1 | 7/2009 | Yee et al. |
| 2009/0302760 A1 | 12/2009 | Tchakarov et al. |
| 2010/0075563 A1 | 3/2010 | Matsui et al. |
| 2010/0117067 A1 | 5/2010 | Sin et al. |

FOREIGN PATENT DOCUMENTS

| | | |
|---|---|---|
| KR | 10-0688795 B1 | 2/2007 |
| KR | 10-0703446 | 3/2007 |
| KR | 10-0732816 B1 | 6/2007 |
| KR | 1020090121501 A | 11/2009 |

* cited by examiner

ORGANIC LIGHT EMITTING DIODE DISPLAY AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Feb. 2, 2010 and there duly assigned Serial No. 10-2010-0009587.

BACKGROUND OF THE INVENTION

1. Field of the Invention

The invention generally relates to an organic light emitting diode (OLED) display and a method of manufacturing the same. More particularly, the invention relates to an organic light emitting diode (OLED) display in which display panel units are reinforced and a method of manufacturing the same.

2. Description of the Related Art

In general, an organic light emitting diode (OLED) display includes two sheets of different substrates coalesced together, a display panel assembly configured to have organic light emitting elements formed therein, a flexible printed circuit (FPC) electrically connected to the display panel assembly through a flexible circuit board, and a support member (or bezel) configured to support the display panel assembly, the flexible printed circuit (FPC), etc.

Recently, the organic light emitting diode (OLED) display has been mounted on mobile devices, such as a mobile phone and a PDA, and it has been gradually downsized.

Accordingly, there is a problem in that the downsized organic light emitting diode (OLED) display is damaged by external impact resulting from dropping, etc. which are caused by a user's mistake while the display is being carried. For this reason, there is a need for a structure for absorbing external impact on the organic light emitting diode (OLED) display.

The above information disclosed in this Background section is only for the enhancement of an understanding of the background of the described technology, and therefore it may contain information that does not form the prior art which is already known in this country to a person of ordinary skill in the art.

SUMMARY OF THE INVENTION

The invention has been developed in an effort to provide an organic light emitting diode (OLED) display and a method of manufacturing the same which provide the advantage of easily absorbing external impact by increasing the amount of reinforcing materials filled between the substrates of display panel units of the organic light emitting diode (OLED) display.

An exemplary embodiment provides an organic light emitting diode (OLED) display comprising a plurality of display panel units, each having first substrate and a second substrate configured to include a pixel area and a non-pixel area other than the pixel area, a sealing member configured to adhere the first substrate and the second substrate together, reinforcing materials filled into the non-pixel area of the first substrate and the second substrate, and an accommodation unit configured to accommodate some of the reinforcing materials within at least one of the first substrate and the second substrate corresponding to the non-pixel area.

The accommodation unit can include a groove formed on the sides of the first substrate and the second substrate of each display panel unit.

A plurality of the grooves can be formed on the sides of the first substrate and the second substrate.

The grooves can be formed by lateral processing using grinders, each comprising penett wheels.

The grinder can comprise a first grinder for processing the sides of the first substrate and a second grinder for processing the sides of the second substrate.

The grooves can be formed by etching. The grooves can be formed in a vertical direction (y-axis) relative to a planar direction (x-axis) of the first and second substrates.

The sealing member can be formed of a frit.

The reinforcing materials can be made of epoxy-based materials.

A method of manufacturing an organic light emitting diode (OLED) display according to an exemplary embodiment comprises: (a) preparing a mother substrate, including a plurality of display panels and cutting lines each between the display panels; (b) cutting the mother substrate into a plurality of display panel units and forming a plurality of grooves on a side of each of the separated display panel units; and (c) filling reinforcing materials in a non-pixel area of the display panel units at the step (b). In this case, when the reinforcing materials are filled, some of the reinforcing materials flow into the grooves.

The step (b) includes forming the grooves in the display panel units using grinders, each including penett wheels.

The grinders can comprise a first grinder and a second grinder mounted on a first substrate and a second substrate, respectively, constituting the display panel units, and can form a plurality of the grooves on sides of the first substrate and the second substrate.

The grooves formed in step (b) can be formed by etching.

Step (b) can comprise: (b-1) adhering a plurality of etching prevention members on sides of the display panel units; and (b-2) forming the plurality of grooves by etching the sides of the display panel units at the step (b-1).

In accordance with the present invention, in the organic light emitting diode (OLED) display, the reinforcing materials are filled into the lateral edges of the display panel units, and grooves are formed in the substrates of the display panel units so that the filled reinforcing materials can flow into the grooves. Accordingly, external impact can be easily absorbed because the filling cross section of the reinforcing materials is expanded.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
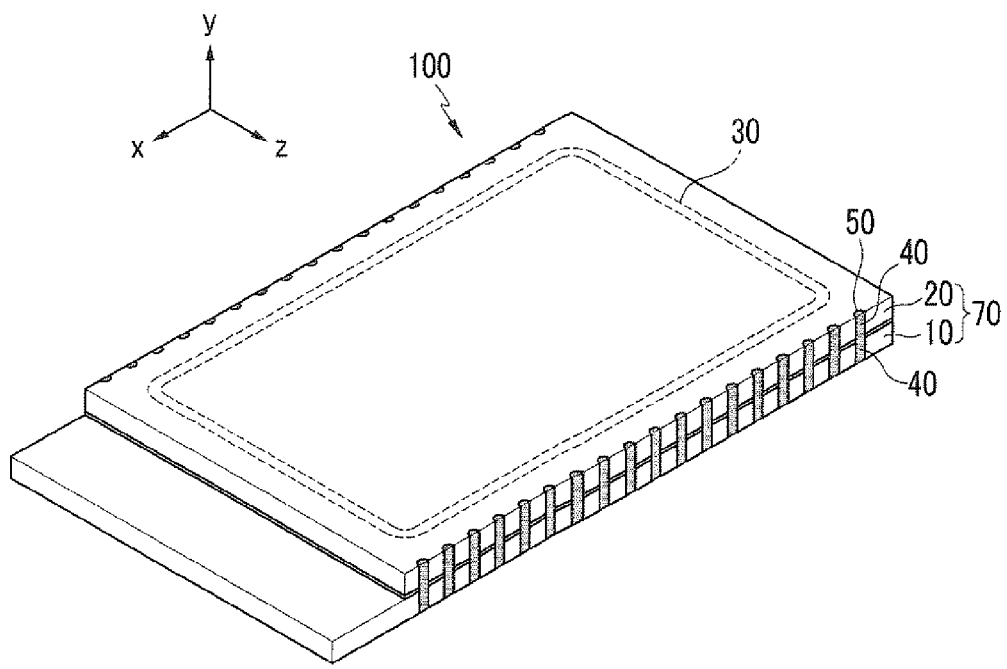
FIG. 1 is a diagram schematically showing an organic light emitting diode (OLED) display according to a first exemplary embodiment of the invention.

Hereinafter, an organic light emitting diode (OLED) display and a method of manufacturing the same according to some exemplary embodiments are described with reference to the accompanying drawings. However, the present invention is not limited to the exemplary embodiments, but may be implemented in various ways. The embodiments are provided to complete the disclosure of the present invention and to allow those having ordinary skill in the art to understand the scope of the present invention.

Furthermore, the size and thickness of each of the elements shown in the drawings is arbitrarily shown for better understanding and ease of description, but the present invention is not limited thereto. In the drawings, the thickness of layers and areas is exaggerated for clarity.

Figure 2:
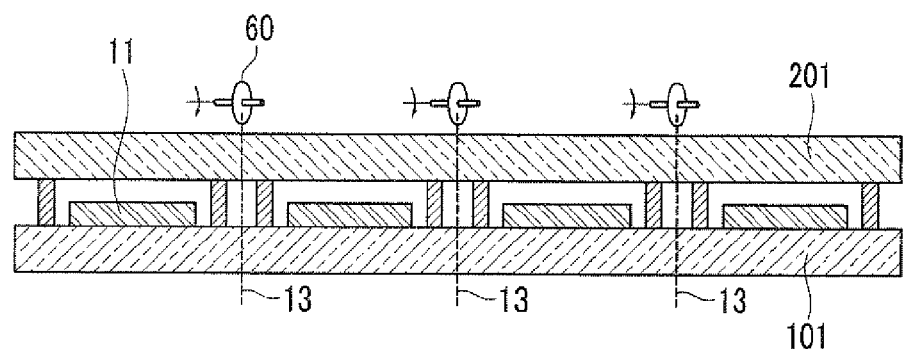
FIG. 2 is a diagram showing that a first substrate member and a second substrate member of a mother substrate form are separated into a plurality of panel units using penett wheels.
Figure 3:
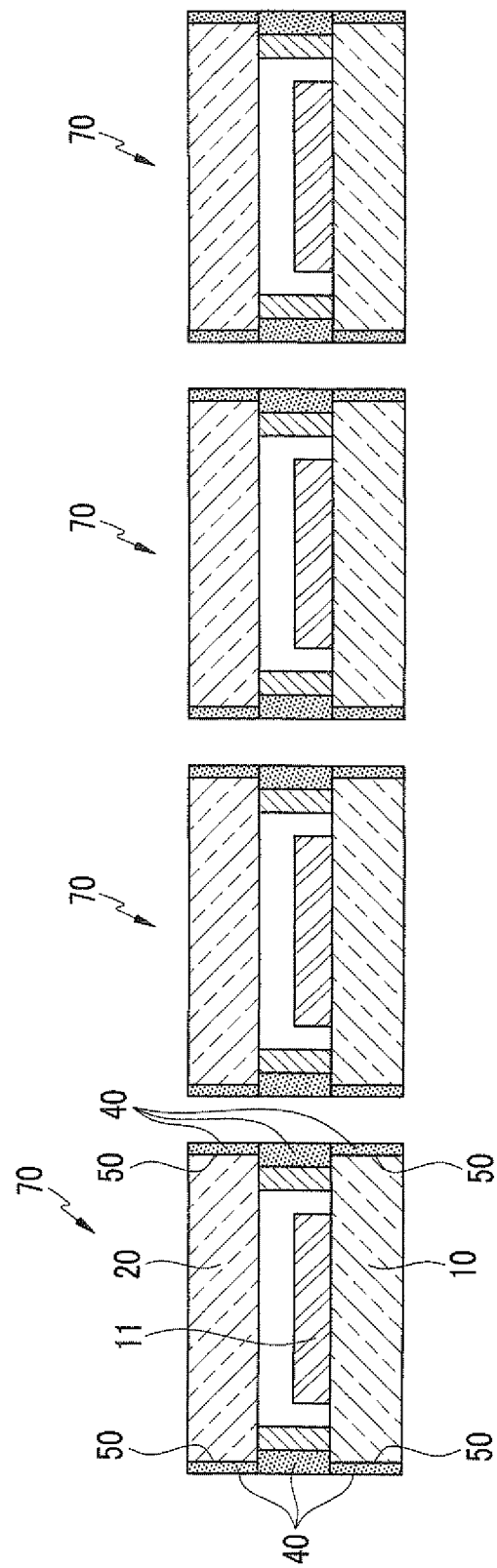
FIG. 3 is a diagram showing a state in which the first substrate member and the second substrate member shown in FIG. 2 are separated into the plurality of panel units.

FIG. 1 is a diagram schematically showing an organic light emitting diode (OLED) display according to a first exemplary embodiment of the invention; FIG. 2 is a diagram showing that a first substrate member and a second substrate member of a mother substrate form are separated into a plurality of panel units using penett wheels; and FIG. 3 is a diagram showing a state in which the first substrate member and the second substrate member shown in FIG. 2 are separated into the plurality of panel units.

As shown in FIG. 1, the organic light emitting diode (OLED) display 100 according to the first exemplary embodiment includes a first substrate 10, a second substrate 20 coalesced with the first substrate 10 to form a display panel 70, a sealing member 30 configured to adhere the first substrate 10 and the second substrate 20 together, reinforcing materials 40 filled between the first substrate 10 and the second substrate 20 of the display panel units, and an accommodation unit 50 configured to accommodate some of the reinforcing materials 40.

The first substrate 10 includes a pixel area in which organic light emitting elements 11 (FIG. 2) are formed and a non-pixel area other than the pixel area. The second substrate 20 is adhered to one area, including the pixel area, of the first substrate 10. In this case, the first substrate 10 is a lower substrate, and the second substrate 20 is an upper substrate.

To adhere the first substrate 10 and the second substrate 20 together, the sealing member 30 is coated along the edge of one face of the first substrate 10. Here, the sealing member 30 is formed of a frit. The frit and the sealing member are hereinafter assigned the same reference numeral 30. The frit 30 includes a filler (not shown) for controlling a coefficient of thermal expansion and an absorbent (not shown) for absorbing a laser or infrared rays.

In the state in which the first substrate 10 and the second substrate 20 are coalesced together, a laser or infrared rays are radiated onto the frit 30, thereby melting the frit 30. Accordingly, the first substrate 10 and the second substrate 20 are adhered together. Since the first substrate 10 and the second substrate 20 are sealed by the frit 30, external oxygen and moisture are prevented from flowing into predetermined inclusions (i.e., the organic light emitting elements 11) formed on the first substrate 10. In the state in which the first substrate 10 and the second substrate 20 are coalesced together, the non-pixel area is filled with the reinforcing materials 40.

As shown in FIG. 3, in the state in which the first substrate 10 and the second substrate 20 of each display panel unit 70 are coalesced together, the reinforcing materials 40 are filled into the non-pixel area. The reinforcing materials 40 are made of epoxy-based materials. Since the reinforcing materials 40 are filled, the dropping of or external impact on the organic light emitting diode (OLED) display can be absorbed. Accordingly, internal damage to the organic light emitting diode (OLED) display can be prevented. Part of the coating portions of the reinforcing materials 40 is accommodated by the accommodation unit 50.

In the state in which the first substrate 10 and the second substrate 20 are coalesced together, the accommodation unit 50 is formed so that some of the reinforcing materials 40 flow into the first and second substrates 10 and 20, respectively. To this end, a groove forming the accommodation unit is formed on the side of the first substrate 10 and the second substrate 20, and so some of the reinforcing materials 40 flow into the groove. The groove and the accommodation unit are hereinafter assigned the same reference numeral 50.

A plurality of the grooves 50 can be formed on the circumference of the first substrate 10 and the second substrate 20.

The grooves 50 are formed in the state in which a mother substrate, including a number of display panels, is separated into unit display panels. This is described in more detail below with reference to FIGS. 2 and 3.

As shown in FIGS. 2 and 3, the first mother substrate members 101 and the second mother substrate members 201, which are coalesced together, are separated into a plurality of display panel units 70 using a cutting apparatus 60.

Figure 4:
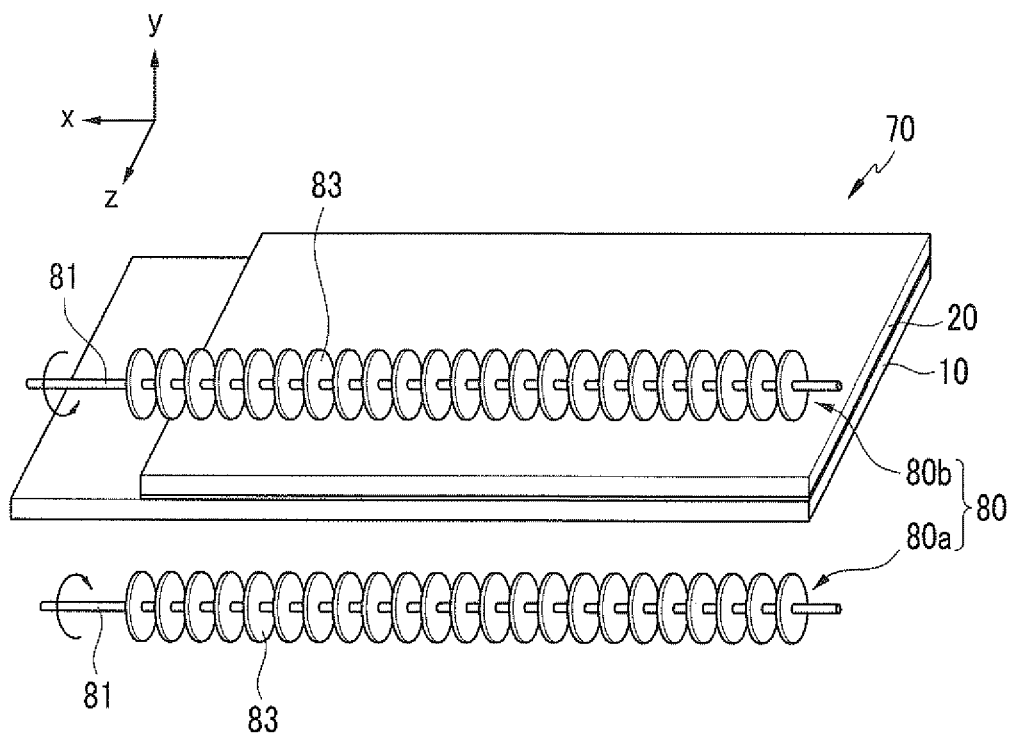
FIG. 4 is a diagram showing the manufacturing of grooves using a pair of grinders.

FIG. 4 is a diagram showing the manufacturing of grooves using a pair of grinders.

Next, the grooves 50 are formed on the sides of the separated display panel units 70 using grinders 80.

As shown in FIG. 4, a plurality of penett wheels 83 are mounted on each of the grinders 80 in the length direction of a shaft 81. The grinders 80 include a first grinder 80a for processing the side of the first substrate 10 and a second grinder 80b for processing the side of the second substrate 20. Accordingly, when the shafts 81 are rotated, the plurality of grooves 50 are formed in each of the sides of the first substrate 10 and the second substrate 20 of each display panel unit 70 in its inner direction. The grooves 50 are formed in a vertical direction (i.e., a y-axis) relative to the planar direction (i.e., an x-axis) of the first and second substrates 10 and 20, respectively. However, the grooves 50 can also be formed so as to have an acute angle or an obtuse angle relative to the planar direction (the x-axis) of the first and second substrates 10 and 20, respectively.

Figure 5:
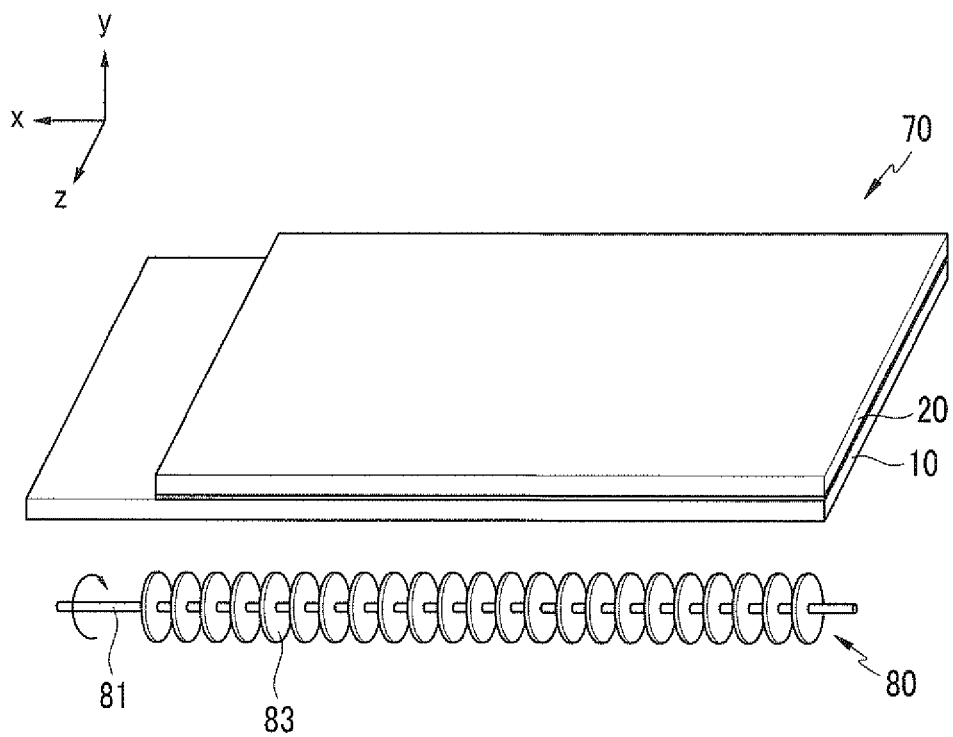
FIG. 5 is a diagram showing the manufacturing of grooves using one grinder.

FIG. 5 is a diagram showing the manufacturing of grooves using one grinder.

In the first exemplary embodiment of FIG. 4, the first and second grinders 80a and 80b are used to process the grooves 50. As shown in FIG. 5, however, the grooves 50 can be formed in the first and second substrates 10 and 20, respectively, using one grinder 80.

Referring back to FIG. 3, the reinforcing materials 40 flow into the formed grooves 50, thereby being capable of further increasing the amount of the reinforcing materials 40 filled into the non-pixel area of the first substrate 10 and the second substrate 20. Accordingly, when external impact is generated, such as by dropping of the organic light emitting diode (OLED) display, an effect of absorbing the amount of impact can be further increased.

Figure 6:
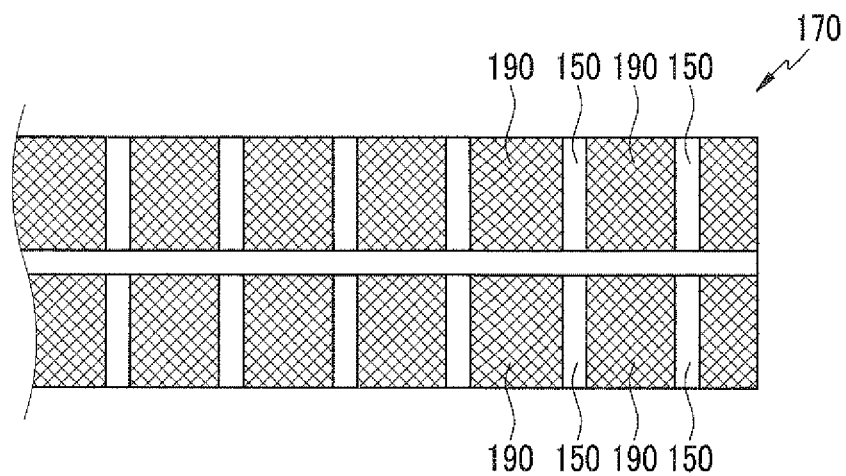
FIG. 6 is a diagram showing the adhesion of tape members for forming grooves for a display panel according to a second exemplary embodiment of the invention.
Figure 7:
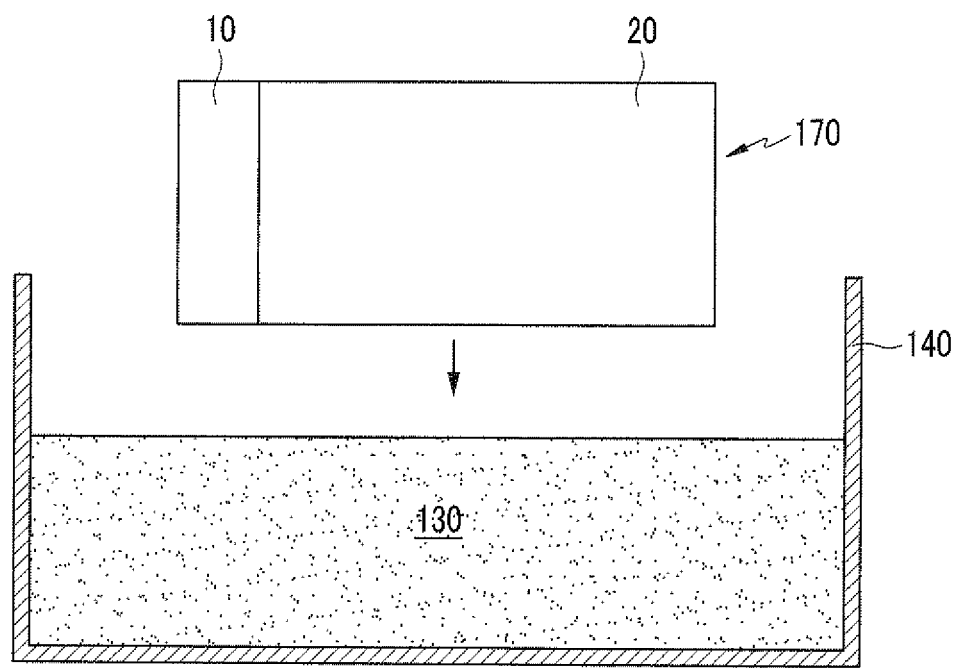
FIG. 7 is a diagram showing the immersion of the display panel, shown in FIG. 3, in an etchant.

FIG. 6 is a diagram showing the adhesion of tape members for forming the grooves for a display panel according to a second exemplary embodiment of the invention, and FIG. 7 is a diagram showing the immersion of the display panel, shown in FIG. 3, in an etchant Reference numerals common to FIGS. 6 and 7 and to FIGS. 1 thru 5 refer to the same constituent elements having the same functions as in FIGS. 1 thru 5, and a description thereof is omitted.

As shown in FIGS. 6 and 7, a plurality of etching prevention members (e.g., tape members) 190 are mounted on the lateral edge of a unit display panel unit 170 according to the second exemplary embodiment of the invention.

More particularly, first, a mother substrate (not shown), including a plurality of display panel units 170, is prepared.

Next, the mother substrate is separated into the plurality of display panel units 170. A number of the tape members 190 are mounted on the sides of each of the display panel units 170 at equal intervals in order to prevent etching.

As shown in FIG. 7, the display panel unit 170 having the tape members 190 mounted on its sides is immersed in the etchant 130 contained in a liquid tank 140. The etchant 130 includes fluoric acid, ammonium fluoride, or a mixture thereof. Furthermore, hydrogen peroxide having strong oxidizing power can be added to the mixture of fluoric acid and ammonium fluoride in order to further improve the etching effect. The components and concentration of the etchant 130 can be properly changed according to the glass composition, the type, etc. of a substrate of the display panel unit 170. Furthermore, the display panel unit 170, etched when etching processing is performed, can be shaken or assigned ultrasonic waves of a weak output.

In this case, portions of the display panel unit 170 (FIG. 6) having the tape members 190 not adhered to its sides are etched, thereby forming grooves 150. Accordingly, the reinforcing materials 40 can flow into the grooves 150 on the sides of the unit display panel 170, and so the area in which the reinforcing materials 40 are filled can be expanded. Consequently, the unit display panel unit 170 can be more stably protected from external impact.

Figure 8:
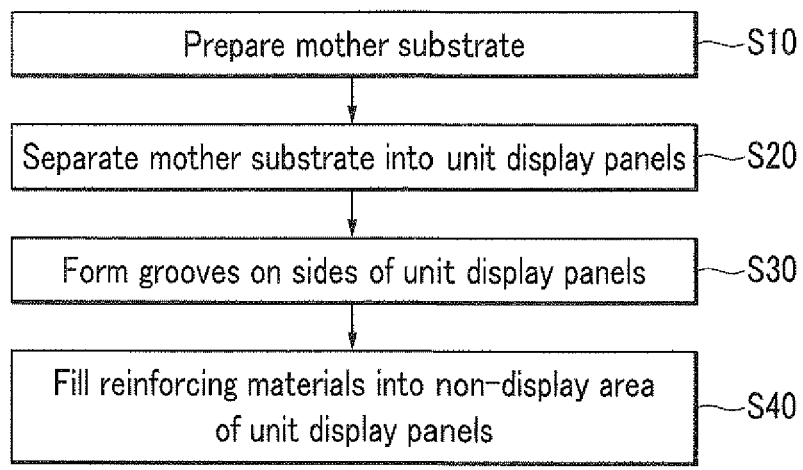
FIG. 8 is a flowchart schematically illustrating a method of manufacturing the organic light emitting diode (OLED) display according to an exemplary embodiment of the invention.

FIG. 8 is a flowchart schematically illustrating a method of manufacturing the organic light emitting diode (OLED) display according to an exemplary embodiment of the invention. Reference numerals common to FIG. 8 and to FIGS. 1 thru 7 refer to the same constituent elements having the same functions as in FIGS. 1 thru 7, and a detailed description thereof is omitted.

First, as shown in FIG. 2, the mother substrates 101 and 201, including cutting lines 13, each between the plurality of display panel units 70, are prepared at step S10.

Next, at step S10 of FIG. 8, the mother substrates 101 and 201 are cut into the display panel units 70, as shown in FIG. 3. Then, the plurality of grooves 50 are formed on the sides of the separated display panel units 70 at step S30. The grooves 50 can be formed in step S30 by processing the sides of the display panel units 70 using the grinders 80 of FIG. 4 or 5. The grinders 80 include the first grinder 80a for processing the first substrate 10 constituting the display panel units 70 and the second grinder 80b for processing the second substrate 20 as seen in FIG. 4. Alternatively, one grinder 80 can be used to process the grooves 50 on the sides of the display panel units 70, as seen in FIG. 5.

Meanwhile, a number of tape members 190 (see FIG. 6) for preventing etching can be mounted at equal intervals on the sides of the display panel units 70, and the display panel units 70 can then be immersed in the etchant, thereby being capable of forming the grooves 50. That is, the grooves 50 are formed because the sides of the display panel units 70, to which the tape members 190 are not adhered, are subject to an etching action.

Next, the reinforcing materials 40 are filled into the non-pixel area of the display panel units 70 at step S40. Accordingly, since the reinforcing materials 40 flow into the grooves 50, damage to the display panel units 70 because of external impact can be prevented.

The present invention has been described in connection with what is presently considered to be practical exemplary embodiments. It is to be understood that the invention is not limited to the disclosed embodiments, but, on the contrary, is intended to cover various modifications and equivalent arrangements included within the spirit and scope of the appended claims. Accordingly, the true scope of the present invention is defined by the appended claims.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device including a plurality of separate display panel units, each display panel unit comprising:
   a first substrate and a second substrate configured to form a pixel area and a non-pixel area other than the pixel area in said each display panel unit;
   a sealing member for adhering the first substrate and the second substrate together in said each display panel unit;
   reinforcing materials filled into the non-pixel area of the first substrate and the second substrate in said each display panel unit; and
   an accommodation unit for accommodating some of the reinforcing materials within at least one of the first substrate and the second substrate corresponding to the non-pixel area of said each display panel unit;
   wherein the accommodation unit includes grooves formed in both sides of each of the first substrate and the second substrate of said each display panel unit.

2. The organic light emitting diode (OLED) display of claim 1, wherein the groove are formed by lateral processing using grinders, each grinder comprising penett wheels.

3. The organic light emitting diode (OLED) display of claim 2, wherein the grinders comprise:
   a first grinder for processing the sides of the first substrate of said each display panel unit; and
   a second grinder for processing the sides of the second substrate of said each display panel unit.

4. The organic light emitting diode (OLED) display of claim 3, wherein the groove is formed in a vertical direction (y-axis) relative to a planar direction (x-axis) of the first and second substrates of said each display panel unit.

5. The organic light emitting diode (OLED) display of claim 2, wherein the groove is formed in a vertical direction (y-axis) relative to a planar direction (x-axis) of the first and second substrates of said each display panel unit.

6. The organic light emitting diode (OLED) display of claim 1, wherein the groove is formed by etching.

7. The organic light emitting diode (OLED) display of claim 6, wherein the groove is formed in a vertical direction (y-axis) relative to a planar direction (x-axis) of the first and second substrates of said each display panel unit.

8. The organic light emitting diode (OLED) display of claim 1, wherein the groove is formed in a vertical direction (y-axis) relative to a planar direction (x-axis) of the first and second substrates of said each display panel unit.

9. The organic light emitting diode (OLED) display of claim 1, wherein the sealing member comprises frit.

10. The organic light emitting diode (OLED) display of claim 1, wherein the reinforcing materials comprise epoxy-based materials.

* * * * *